(12) United States Patent
Kim et al.

(10) Patent No.: US 7,388,264 B2
(45) Date of Patent: Jun. 17, 2008

(54) SEMICONDUCTOR DEVICE HAVING LDD-TYPE SOURCE/DRAIN REGIONS AND FABRICATION METHOD THEREOF

(75) Inventors: Do-Hyung Kim, Seoul (KR); Jin-Ho Kim, Kyunggi-do (KR); Byung-Jun Hwang, Kyunggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 52 days.

(21) Appl. No.: 10/948,883

(22) Filed: Sep. 24, 2004

(65) Prior Publication Data
US 2005/0045921 A1 Mar. 3, 2005

Related U.S. Application Data

(62) Division of application No. 10/121,205, filed on Apr. 11, 2002, now Pat. No. 6,818,489.

(30) Foreign Application Priority Data
May 4, 2001 (KR) ............................... 2001-24332

(51) Int. Cl.
*H01L 29/06* (2006.01)
(52) U.S. Cl. ...................... 257/408; 257/213
(58) Field of Classification Search .............. 257/212, 257/213, 382, 383, 384, 405, 402, 406, 408, 257/344, 314, 324, 326, E21.576, E21.62, 257/E21.59, E27.08, E29.129, E29.309, 336
See application file for complete search history.

(56) References Cited

U.S. PATENT DOCUMENTS 6,180,464 B1 1/2001 Krivokapic et al.

2001/0009805 A1* 7/2001 Ha et al. .................... 438/637
2002/0132403 A1* 9/2002 Hung et al. ................. 438/186
2004/0175919 A1* 9/2004 Ha et al. .................... 438/620

FOREIGN PATENT DOCUMENTS

KR 2001-0004237 1/2001
KR 2001-0030127 4/2001

* cited by examiner

*Primary Examiner*—Thomas L. Dickey
*Assistant Examiner*—Fazli Erdem
(74) *Attorney, Agent, or Firm*—Marger Johnson & McCollom, P.C.

(57) ABSTRACT

A semiconductor device having LDD-type source/drain regions and a method of fabricating the same are provided. The semiconductor device includes at least a pair of gate patterns disposed on a semiconductor substrate and LDD-type source/drain regions disposed at both sides of the gate patterns. The substrate having the gate patterns and the LDD-type source/drain regions is covered with a conformal etch stop layer. The etch stop layer is covered with an interlayer insulating layer. The LDD-type source/drain region is exposed by a contact hole that penetrates the interlayer insulating layer and the etch stop layer. The method of forming the LDD-type source/drain regions and the etch stop layer includes forming low-concentration source/drain regions at both sides of the gate patterns and forming the conformal etch stop layer on the substrate having the low-concentration source/drain regions. Gate spacers are then formed on the sidewalls of the gate patterns. Using the gate patterns and the gate spacers as implantation masks, impurity ions are implanted into the semiconductor substrate to form high-concentration source/drain regions. The spacers are then selectively removed. An interlayer insulating layer is formed on the substrate where the spacers are removed.

16 Claims, 7 Drawing Sheets

SEMICONDUCTOR DEVICE HAVING LDD-TYPE SOURCE/DRAIN REGIONS AND FABRICATION METHOD THEREOF

This application is a divisional of U.S. patent application Ser. No. 10/121,205, filed Apr. 11, 2002 now U.S. Pat. No. 6,818,489, now pending, which is incorporated herein by reference in their entirety.

FIELD OF THE INVENTION

The present invention relates to semiconductor devices and fabrication methods thereof and, more specifically, to semiconductor devices having LDD-type source/drain regions and fabrication methods thereof.

BACKGROUND OF THE INVENTION

As semiconductor devices become more highly integrated, various techniques for forming LDD-type source/drain regions are widely used in order to improve reliability of MOS transistors. In these techniques, it is required to form a gate spacer on sidewalls of the gate electrodes in order to form the LDD-type source/drain regions. In addition, a self-aligned contact technology has been developed in order to increase the integration density of the semiconductor device. Accordingly, a silicon nitride layer is widely used as a material layer for forming the gate spacer. This is because the gate spacer should have an etching selectivity with respect to an interlayer insulating layer comprising a silicon oxide layer.

FIGS. 1 to 3 are cross-sectional views illustrating a conventional method of fabricating a semiconductor device.

Referring to FIG. 1, an isolation layer 2 is formed at a predetermined region of a semiconductor substrate 1 to define an active region. After formation of a gate insulating layer 3 on the active region, a gate electrode layer and a capping layer are sequentially formed on an entire surface of the substrate including the gate insulating layer 3. The capping layer and the gate electrode layer are successively patterned to form a pair of gate patterns 8 that cross over the gate insulating layer 3. Incidentally, the gate insulating layer 3 may be over-etched. Thus, the active region can be exposed. Each of the gate patterns 8 comprises a gate electrode 5 and a capping layer pattern 7, which are sequentially stacked.

Impurity ions are implanted into the active region at a dose of $1 \times 10^{12}$ to $1 \times 10^{14}$ atoms/cm2 using the gate patterns 8 as ion implantation masks, thereby forming relatively low-concentration source/drain regions 9 at the active region. A gate spacer 11, which is composed of a silicon nitride layer, is then formed on the sidewalls of the gate patterns 8. Using the gate spacer 11 and the gate patterns 8 as ion implantation masks, impurity ions are implanted into the low concentration source/drain regions 9 at a dose of $1 \times 10^{15}$ to $5 \times 10^{15}$ atoms/cm$^2$ to form relatively high-concentration source/drain regions 13. The relatively low-concentration source/drain region 9 and the relatively high-concentration source/drain region 13 constitute an LDD-type source/drain region 15.

Referring to FIG. 2, an etch stop layer 17 is formed on an entire surface of the substrate having the LDD-type source/drain region 15. The etch stop layer 17 is formed of a silicon nitride layer having an etch selectivity with respect to a silicon oxide layer. Thus, a width W1 of a region, surrounded by the etch stop layer 17 between the adjacent gate patterns 8 is remarkably reduced as compared to the space between the gate patterns 8. This is due to the presence of the gate spacer 11 and the etch stop layer 17. As a result, the aspect ratio of the region, which is surrounded by the etch stop layer 17, is increased. An interlayer insulating layer 19 is then formed on the entire surface of the substrate including the etch stop layer 17. At this time, a void 21 might be formed in the interlayer insulating layer 19 between the adjacent gate patterns 8. This is because the region surrounded by the etch stop layer 17 has a high aspect ratio. Such a void 21 degrades the reliability of the semiconductor device.

Referring to FIG. 3, the interlayer insulating layer 19 and the etch stop layer 17 are successively patterned to form a first contact hole 23a and a second contact hole 23b concurrently. The first contact hole 23a exposes the LDD-type source/drain region 15 between the gate patterns 8 and the second contact hole 23b exposes the LDD-type source/drain region 15 adjacent the isolation layer 2. The etch stop layer 17 prevents the isolation layer 2 from being recessed. It is difficult to maximize the surface area of the LDD-type source/drain regions 15, which are exposed by the first and second contact holes 23a and 23b, due to the gate spacer 11. In particular, in the event that mis-alignment occurs during the photolithography process for forming the first and second contact holes 23a and 23b as shown in FIG. 3, the surface area of the LDD-type source/drain region 15 exposed by the first contact hole 23a is reduced.

According to the conventional technique as described above, it is difficult to maximize the surface area of the LDD-type source/drain region exposed by the contact hole. This is due to the gate spacer, which is formed of a silicon nitride layer. Accordingly, it is difficult to reduce contact resistance in the semiconductor device. In addition, a void may be formed in the interlayer insulating layer due to the gate spacer. Such a void may lead to reliability degradation of the semiconductor device.

SUMMARY OF THE INVENTION

It is therefore a feature of the present invention to provide methods of fabricating a semiconductor device capable of improving the reliability of the semiconductor as well as minimizing the contact resistance in the semiconductor device.

It is another feature of the present invention to provide semiconductor devices having maximized contact area and interlayer insulating layer, without voids.

The invention semiconductor device fabricating method includes forming at least one insulated gate pattern on a semiconductor substrate and forming low-concentration source/drain regions at the semiconductor substrate that is located at both sides of the gate pattern. A first conformal etch-stop layer is formed on an entire surface of the substrate having the low-concentration source/drain regions. A spacer is then formed on the sidewall of the gate pattern. Thus, a portion of the first etch stop layer intervenes between the spacer and the gate pattern. The spacer is formed of an insulating layer having etch selectivity with respect to the first etch stop layer.

Using the gate pattern and the spacer as ion implantation masks, impurity ions are implanted into the low-concentration source/drain regions to form high-concentration source/drain regions having higher concentration than the low-concentration source/drain regions. As a result, the LDD-type source/drain regions, which are composed of the low concentration source/drain regions and the high concentration source/drain regions, are formed at both sides of the gate pattern. The spacer is then selectively removed.

In this way, the aspect ratio of the region, which is surrounded by the first etch stop layer between the adjacent gate patterns, becomes reduced. An interlayer insulating layer is formed on the substrate where the spacer is removed. Accordingly, it is possible to remarkably reduce the probability of a void being formed in the interlayer insulating layer, since the spacer is removed. The interlayer insulating layer and the first etch stop layer are successively patterned to form a contact hole that exposes the LDD-type source/drain region. Accordingly, it is possible to maximize the surface area of the exposed LDD-type source/drain region, since the spacer does not exist any more.

Preferably, a second etch stop layer is formed on the resultant structure where the spacer is removed, prior to formation of the interlayer insulating layer.

The first and second etch stop layers are preferably formed of a material layer having an etch selectivity with respect to the interlayer insulating layer and the spacer. More particularly, the first and second etch stop layers may be formed of a silicon nitride layer or a silicon oxynitride layer, and the spacer may be formed of a silicon oxide layer. Also, the interlayer insulating layer is preferably formed of the silicon oxide layer such as a silicon oxide layer containing impurities or an undoped silicate glass (USG) layer.

An other feature of the invention involves a semiconductor device having LDD-type source/drain regions. The semiconductor device includes at least one insulated gate pattern, which is disposed on a semiconductor substrate. LDD-type source/drain regions are formed at the semiconductor substrate, which is located at both sides of the gate pattern. The substrate having the gate pattern and the LDD-type source/drain regions are covered with a first conformal etch stop layer. In other words, the surface profile of the first etch stop layer is identical to that of the substrate having the gate pattern and the LDD-type source/drain regions. The first etch stop layer is covered with an interlayer insulating layer. The LDD-type source/drain region is exposed by a contact hole that penetrates the interlayer insulating layer and the first etch stop layer.

Preferably, a second etch stop layer is interposed between the first etch stop layer and the interlayer insulating layer. Each of the LDD-type source/drain regions comprises a low-concentration source/drain region and a high-concentration source/drain region. The high-concentration source/drain region is spaced apart from the edge of the gate pattern, and the low-concentration source/drain region is extended to overlap with the gate pattern.

DESCRIPTION OF THE PREFERRED EMBODIMENT

Figure 1:
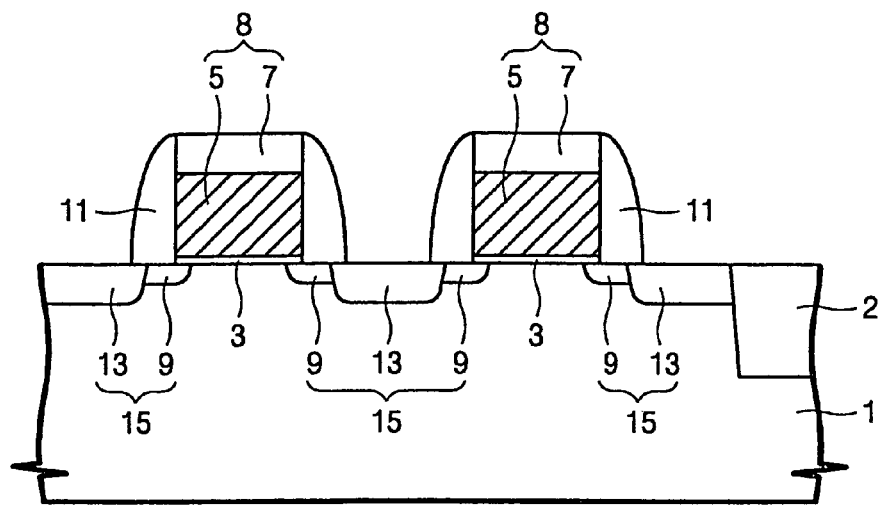
FIGS. 1 to 3 are cross-sectional views illustrating a conventional method of fabricating a semiconductor device.
Figure 2:
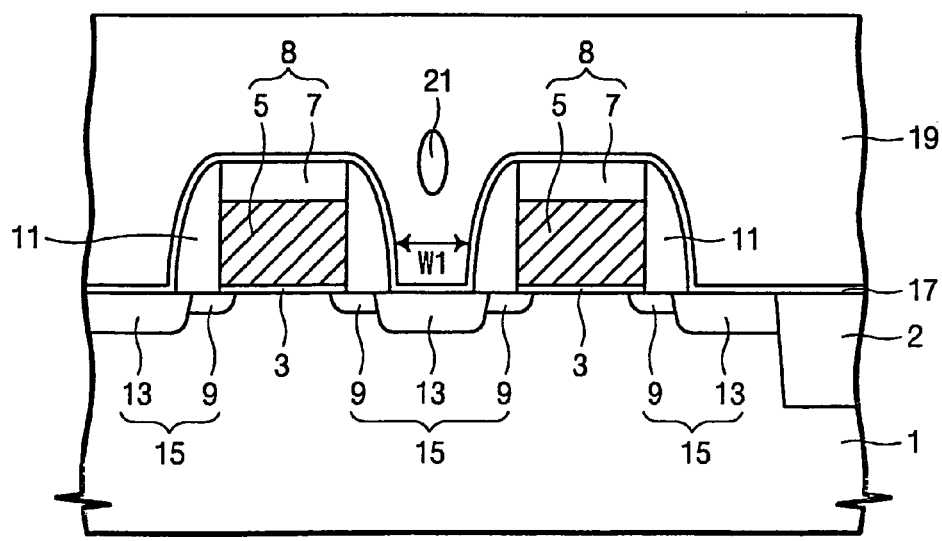
Figure 3:
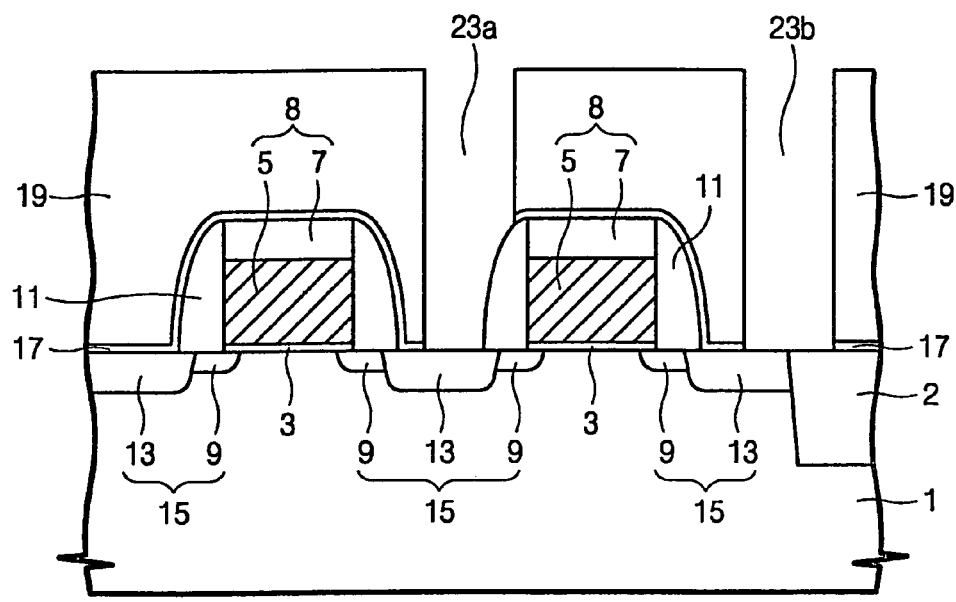

The present invention will now be described more fully hereinafter with reference to the accompanying drawings, in which preferred embodiments of the invention are shown. This invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. Like numbers refer to like elements throughout the specification.

Figure 4:
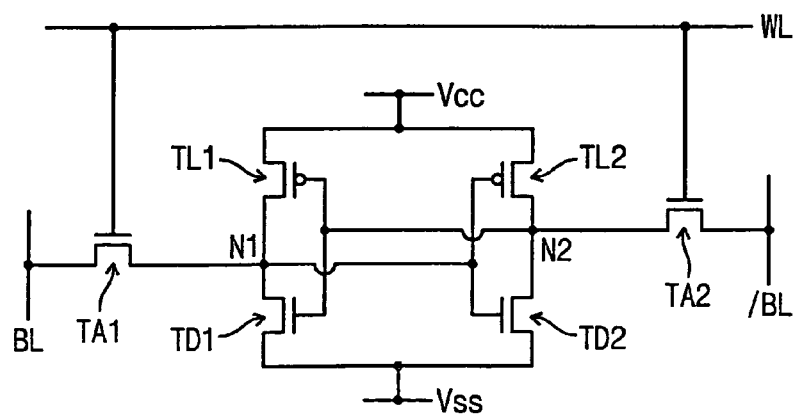
FIG. 4 is an equivalent circuit diagram of a typical full CMOS SRAM cell.

FIG. 4 is an equivalent circuit diagram of a typical full CMOS SRAM cell.

Referring to FIG. 4, the full CMOS SRAM cell includes a pair of driver transistors TD1 and TD2, a pair of access transistors TA1 and TA2, and a pair of load transistors TL1 and TL2. The pair of driver transistors TD1 and TD2 and the pair of access transistors TA1 and TA2 are NMOS transistors, and the pair of load transistors TL1 and TL2 are PMOS transistors. Source regions of the first and second driver transistors TD1 and TD2 are connected to a ground line Vss, and source regions of the first and second load transistors TL1 and TL2 are connected to a power line Vcc. Also, a drain region of the first driver transistor TD1 is connected to a drain region of the first load transistor TL1 to constitute a first node N1. Similarly, a drain region of the second driver transistor TD2 is connected to a drain region of the second load transistor TL2 to constitute a second node N2.

Gate electrodes of the first driver transistor TD1 and the first load transistor TL1 are connected to the second node N2, and gate electrodes of the second driver transistor TD2 and the second load transistor TL2 are connected to the first node N1. The first node N1 is connected to a source region of the first access transistor TA1, and a drain region of the first access transistor TA1 is connected to a first bit line BL. Also, the second node N2 is connected to a source region of the second access transistor TA2, and a drain region of the second access transistor TA2 is connected to a second bit line /BL. The first bit line BL always has a data opposite to the second bit line /BL. For example, in the event that the first bit line BL has the data corresponding to logic "0", the second bit line /BL has the data corresponding to logic "1". In addition, gate electrodes of the first and second access transistors TA1 and TA2 are connected to a word line WL. Actually, the word line WL acts as the gate electrodes of the first and second access transistors TA1 and TA2.

The principle of the full CMOS SRAM cell operation has been already known in the art. Thus, the explanation of the cell operation will be omitted in this specification.

Next, a method of fabricating the SRAM cell will be described with reference to FIGS. 5 to 8. In the drawings, reference characters "a" and "b" denote a first contact region and a second contact region, respectively.

Figure 5:
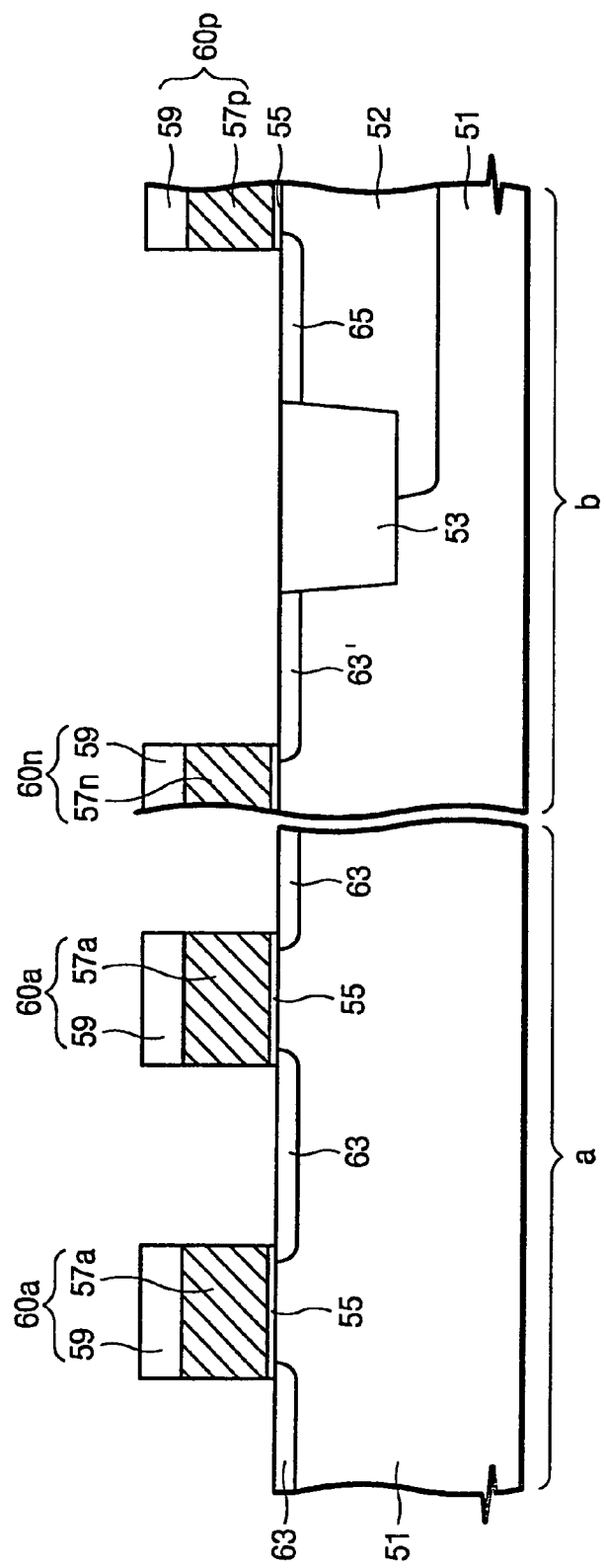
FIGS. 5 to 8 are cross-sectional views illustrating a method of fabricating a semiconductor device in accordance with an embodiment of the present invention.

Referring to FIG. 5, an isolation layer 53 is formed at a predetermined region of a semiconductor substrate of a first conductivity type, thereby defining active regions. Impurity ions of a second conductivity type are selectively implanted into a portion of the second contact region "b" to form a well 52 of the second conductivity type. In this embodiment, the first conductivity and the second conductivity are p-type and n-type, respectively. However, the first conductivity and the second conductivity may be n-type and p-type, respectively. As a result, a first conductivity type active region and a second conductivity type active region are formed in the second contact region "b". The isolation layer 53 may be formed after forming the second conductivity type well 52.

A gate insulating layer 55 is formed on the active regions of the substrate having the isolation layer 53 and the second conductivity type well 52. A gate electrode layer and a capping layer are sequentially formed on the entire surface of the substrate having the gate insulating layer 55. The capping layer is preferably formed of an insulating layer having an etch selectivity with respect to a silicon oxide layer which is widely used as an interlayer insulating layer. For example, the capping layer can be formed of a silicon nitride layer or a silicon oxynitride layer.

The capping layer and the gate electrode layer are successively patterned to form a pair of first gate patterns 60a crossing over the active region in the first contact region "a" and to concurrently form second gate patterns 60n and 60p crossing over the active regions in the second contact region "b". Thus, each of the first gate patterns 60a comprises a first gate electrode 57a and a capping layer pattern 59 which are sequentially stacked, and the second gate pattern 60n comprises a second gate electrode 57n and the capping layer pattern 59, which are sequentially stacked. Similarly, the second gate pattern 60p comprises a second gate electrode 57p and the capping layer pattern 59, which are sequentially stacked. In the event that the gate insulating layer 55 is over-etched during the etching process for forming the first and second gate patterns 60a, 60n and 60p, the semiconductor substrate 51 and the second conductivity type well 52 may be exposed.

A thermal oxidation process can be then applied to the resultant structure where the first and second gate patterns 60a, 60n and 60p are formed. This thermal oxidation process is performed in order to cure the etch damage applied to the substrate 51 during the etching process for forming the first and second gate patterns 60a, 60n and 60p. The second gate pattern 60n runs across a first conductivity type active region in the second contact region "b", and the second gate pattern 60p runs across a second conductivity type active region in the second conductivity type well 52.

Using the first and second gate patterns 60a and 60n and the isolation layer 53 as implantation masks, impurity ions of the second conductivity type are selectively implanted into the semiconductor substrate 51 at a relatively low dose of $1\times10^{12}$ atoms/cm$^2$ to $1\times10^{14}$ atoms/cm$^2$. Thus, first low-concentration source/drain regions 63 are formed at the active region in the first contact region "a", and second low-concentration source/drain regions 63' are formed at the first conductivity type active region in the second contact region "b". The first and second low-concentration source/drain regions 63 and 63' are concurrently formed.

Subsequently, using the second gate patterns 60p and the isolation layer 53 as implantation masks, impurity ions of the first conductivity type are selectively implanted into the second conductivity type well 52 at a relatively low dose of $1\times10^{12}$ atoms/cm$^2$ to $1\times10^{14}$ atoms/cm$^2$. Accordingly, second low-concentration source/drain region 65 of the first conductivity type is formed at the active region in the well 52.

Figure 6:
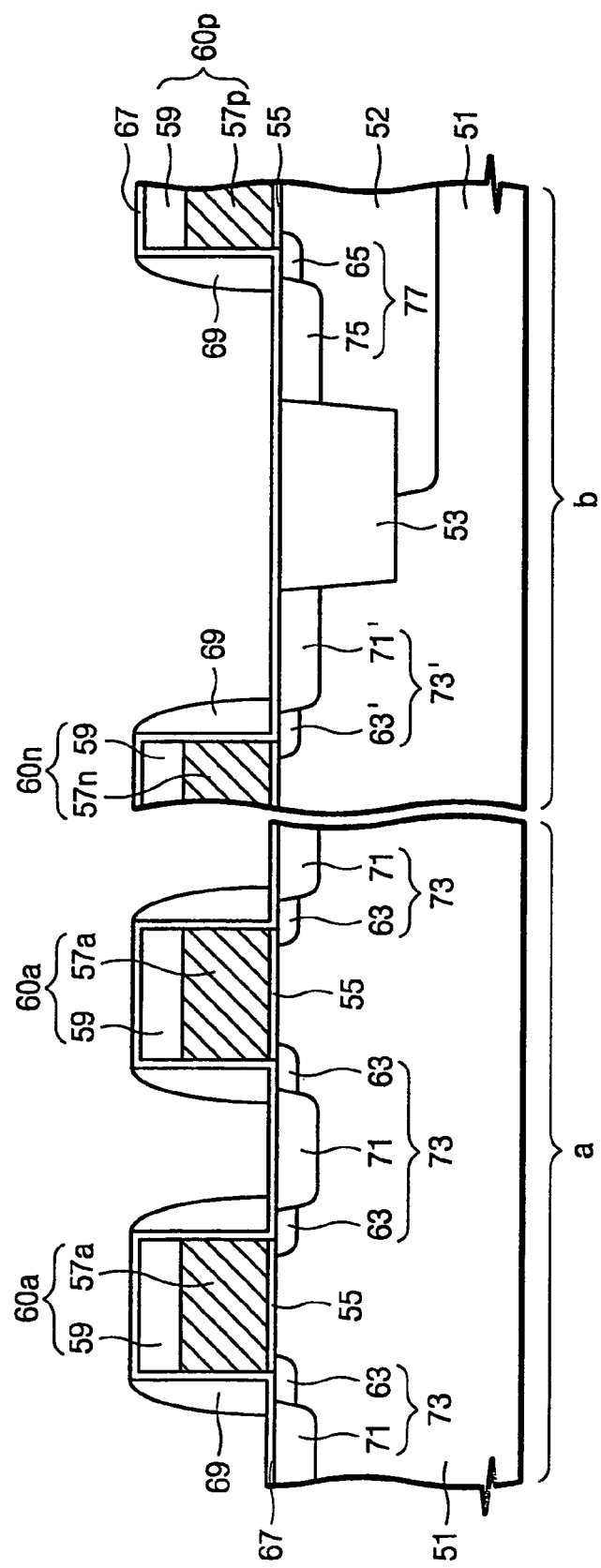

Referring to FIG. 6, a first conformal etch stop layer 67 is formed on the substrate having the first and second low-concentration source/drain regions 63, 63' and 65. The first etch stop layer is preferably formed of an insulating layer having an etch selectivity with respect to a silicon oxide layer, for example, a silicon nitride layer or a silicon oxynitride layer. A CVD (chemical vapor deposition) oxide layer is formed on the substrate having the first etch stop layer 67. The CVD oxide layer is then anisotropically etched to form gate spacers 69 on the sidewalls of the first and second gate patterns 60a, 60n and 60p.

Using the first gate patterns 60a, the second gate patterns 60n, the gate spacers 69 and the isolation layer 53 as implantation masks, impurity ions of the second conductivity type are selectively implanted into the semiconductor substrate 51 at a relatively high dose of $1\times10^{15}$ atoms/cm$^2$ to $5\times10^{15}$ atoms/cm$^2$. As a result, a first high-concentration source/drain region 71 and a second high-concentration source/drain region 71' are formed at the first low-concentration source/drain region 63 and the second low-concentration source/drain region 63', respectively. Consequently, the first and second-high concentration source/drain regions 71 and 71' are concurrently formed.

The first low-concentration source/drain region 63 and the first high-concentration source/drain region 71, which are formed in the first contact region "a", constitute a first LDD-type source/drain region 73. Also, the second low-concentration source/drain region 63' and the second high-concentration source/drain region 71', which are formed in the second contact region "b", constitute a second LDD-type source/drain region 73'. The first LDD-type source/drain region 73 has the same conductivity type as the second LDD-type source/drain region 73'.

Subsequently, using the second gate patterns 60p, the gate spacers 69 and the isolation layer 53 as implantation masks, impurity ions of the first conductivity type are selectively implanted into the second conductivity type well 52 at a relatively high dose of $1\times10^{15}$ atoms/cm$^2$ to $5\times10^{15}$ atoms/cm$^2$. Thus, another second high-concentration source/drain region 75 of the first conductivity type is formed at the second low-concentration source/drain region 65. The second low-concentration source/drain region 65 and the second high-concentration source/drain region 75, which are formed in the second conductivity type well 52, constitute another second LDD-type source/drain region 77. The conductivity type of the second LDD-type source/drain region 77 is opposite that of the second LDD-type source/drain region 73'.

Figure 7:
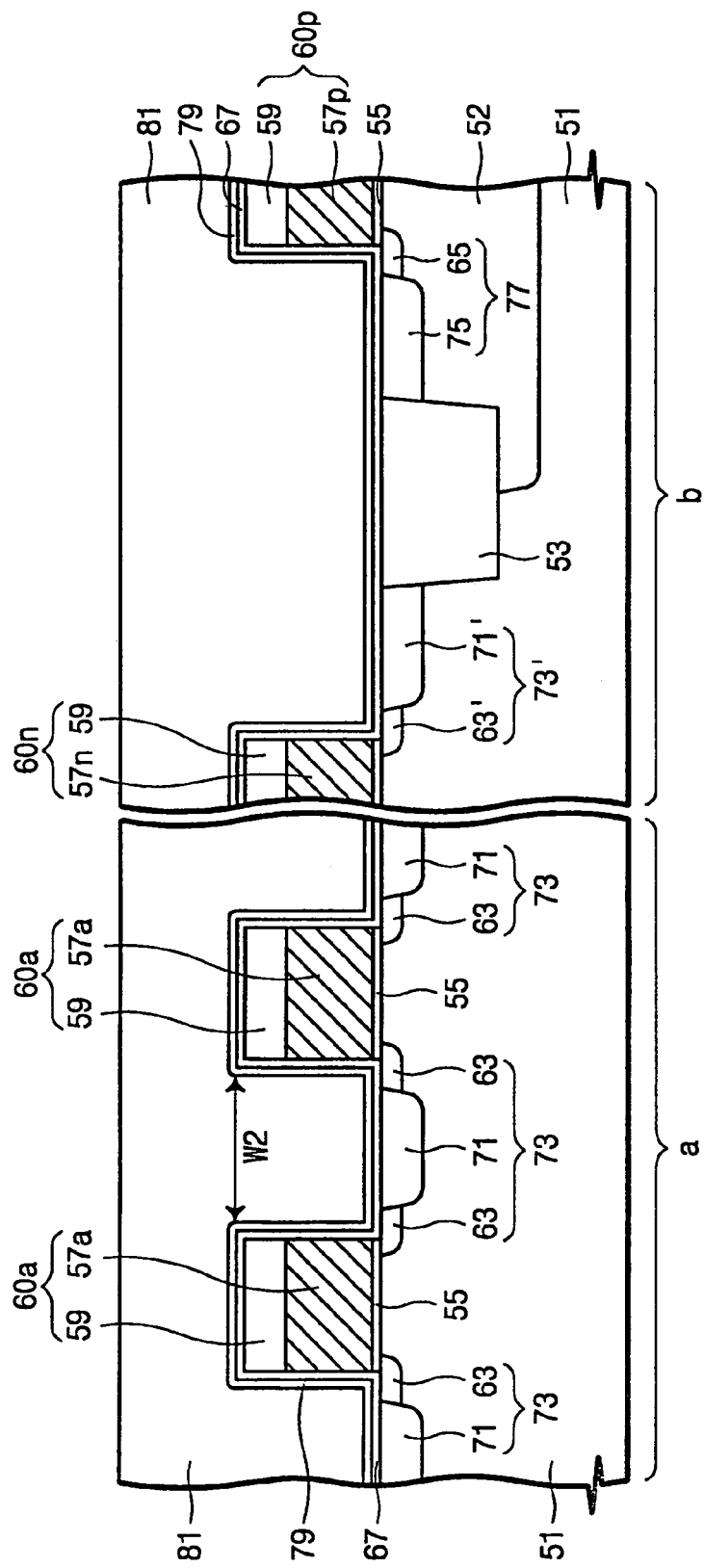

Referring to FIG. 7, the gate spacers 69 are selectively removed. A second etch stop layer 79 is preferably formed on the resultant structure where the gate spacers 69 are removed. This is because the first etch stop layer 67 can be etched away during the etching process for forming the gate spacers 69 or the removing process of the gate spacers 69. The second etch stop layer 79 preferably is formed of the same material layer as the first etch stop layer 67. As a result, it is possible to maximize the substantial space W2 between the gate patterns, since the gate spacers 69 are removed after forming the first and second LDD-type source/drain regions 73, 73' and 77. In other words, it is possible to reduce the aspect ratio of the gap region between the gate patterns as compared with the conventional art. Also, it is easy to optimize the electrical characteristic and the reliability of the MOS transistor by appropriately adjusting the width of the spacers 69.

An interlayer insulating layer 81 is formed on the resultant structure where the second etch stop layer 79 is formed. At this time, it can prevent a void from being formed in the interlayer insulating layer 81, since the aspect ratio of the gap region between the gate patterns is remarkably reduced as compared with the conventional art. The interlayer insulating layer 81 may be formed of a silicon oxide layer containing impurities or a USG layer.

Figure 8:
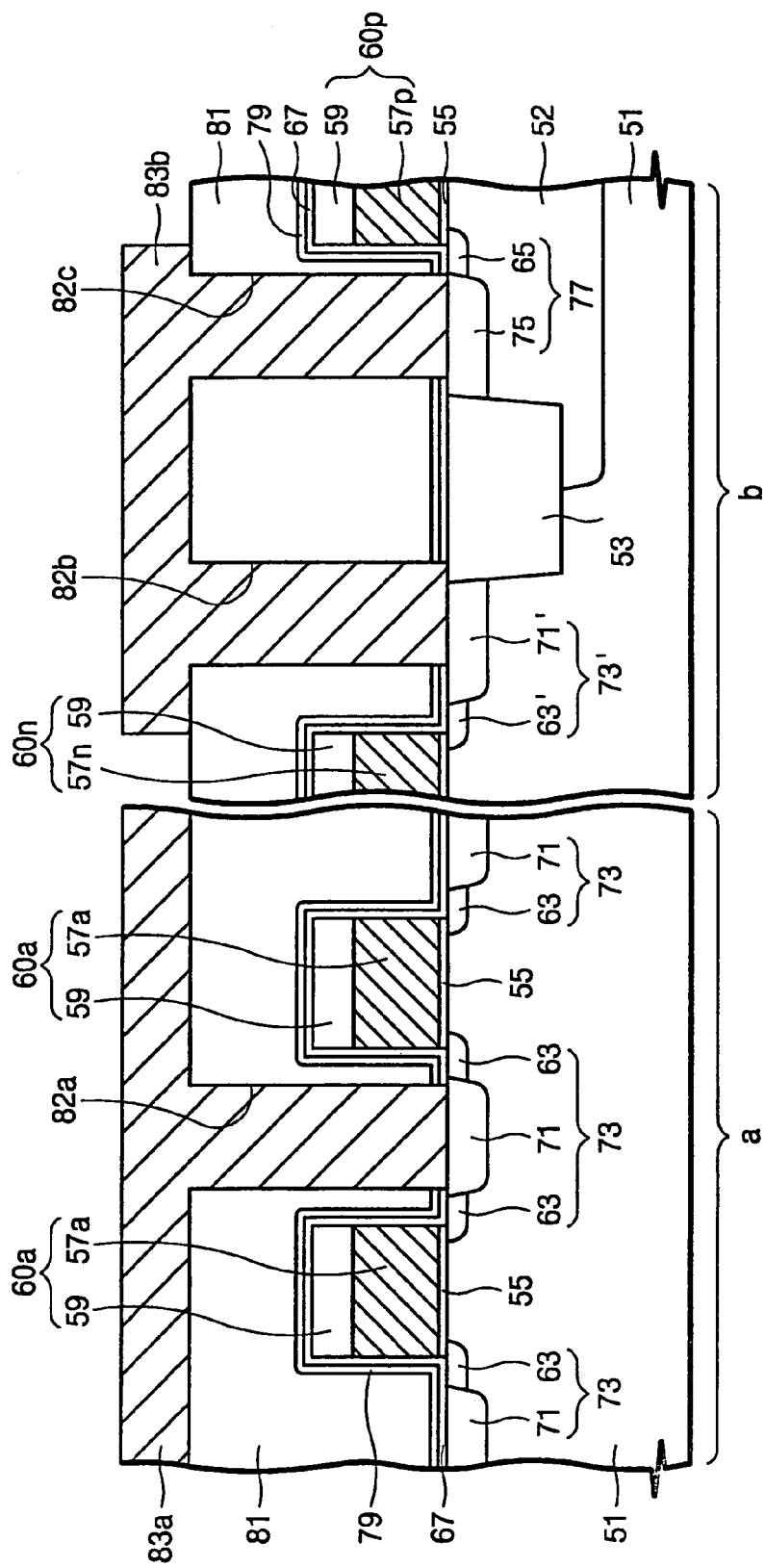

Referring to FIG. 8, the interlayer insulating layer 81, the second etch stop layer 79 and the first etch stop layer 67 are successively patterned to form a first contact hole 82a that exposes the first LDD-type source/drain region 73 and second contact holes 82b and 82c that expose the second LDD-type source/drain regions 73' and 77. Here, in the event that the semiconductor substrate 51 is p-type and the well 52 is n-type, the first contact hole 82a corresponds to a bit line contact hole or a ground line contact hole, and the second contact holes 82b and 82c correspond to node contact holes. As a result, the first gate electrodes 57a correspond to the adjacent two word lines of the two SRAM cells or the gate electrodes of the first and second driver transistors (TD1 and TD2 of FIG. 4), and the second gate electrode 57n corresponds to the gate electrode of the first or second driver transistor TD1 or TD2. Also, the second gate electrode 57p corresponds to the gate electrode of the first or second load transistor (TL1 or TL2 of FIG. 4).

On the contrary, in the event that the semiconductor substrate 51 is n-type and the well 52 is p-type, the first contact hole 82a corresponds to power line contact hole, and the second contact holes 82b and 82c correspond to node contact holes. As a result, the first gate electrodes 57a correspond to the gate electrodes of the first and second load transistors TL1 and TL2, and the second gate electrode 57n corresponds to the gate electrode of the first or second load transistor TL1 or TL2. Also, the second gate electrode 57p corresponds to the gate electrode of the first or second driver transistor TD1 or TD2 or the word line WL.

A conductive layer is then formed on the substrate having the first and second contact holes 82a, 82b and 82c. The conductive layer is patterned to form a first interconnection 83a covering the first contact hole 82a and a second interconnection 83b covering the second contact holes 82b and 82c. The first interconnection 83a corresponds to the bit line (BL or /BL of FIG. 4), the ground line (Vss of FIG. 4) or the power line (Vcc of FIG. 4), and the second interconnection 83b corresponds to a local interconnection covering the first node (N1 of FIG. 4) or the second node (N2 of FIG. 4).

Figure 9:
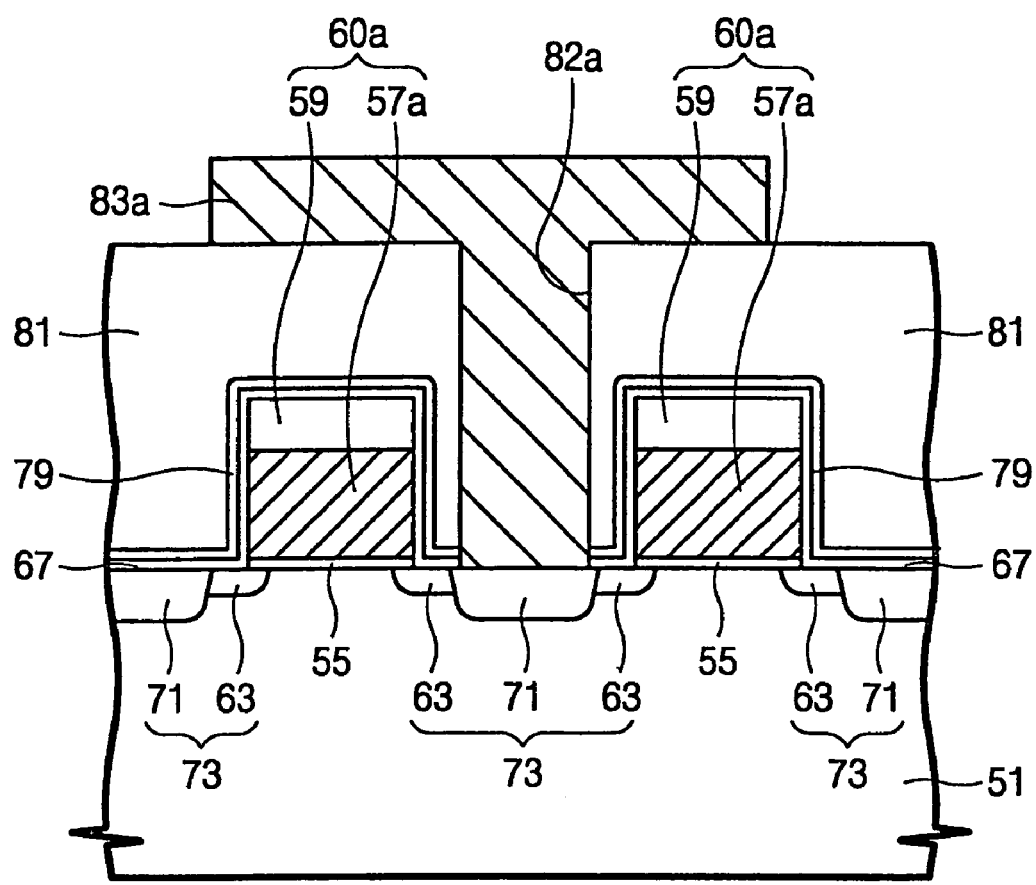
FIG. 9 is a cross-sectional view illustrating a semiconductor device in accordance with an embodiment of the present invention.

FIG. 9 is a cross-sectional view of a full CMOS SRAM cell according to the present invention.

Referring to FIG. 9, a pair of insulated gate patterns 60a are disposed on a semiconductor substrate 51 of a first conductivity type. A gate insulating layer 55 is interposed between the pair of gate patterns 60a and the semiconductor substrate 51. Each of the gate patterns 60a comprises a gate electrode 57a and a capping layer pattern 59, which are sequentially stacked. The gate electrodes 57a correspond to the word lines of the SRAM cells (WL of FIG. 4), the gate electrodes of the driver transistors (TD1 and TD2 of FIG. 4), the gate electrodes of the access transistors (TA1 and TA2 of FIG. 4), or the gate electrodes of the load transistors (TL1 and TL2 of FIG. 4). Preferably, the capping layer pattern 59 is an insulating layer having an etch selectivity with respect to a silicon oxide layer. For example, the capping layer pattern 59 is a silicon nitride layer or a silicon oxynitride layer.

LDD-type source/drain regions 73 of a second conductivity type are disposed at the semiconductor substrate 51, which are located at both sides of the gate patterns 60a. Each of the LDD-type source/drain regions 73 comprises a low-concentration source/drain region 63 adjacent to the edge of the gate pattern 60a and a high-concentration source/drain region 71 spaced apart from the edge of the gate pattern 60a. Here the second conductivity type is opposite the first conductivity type. For example, in the event that the first conductivity type is p-type, the second conductivity type is n-type. On the contrary, in the event that the first conductivity type is n-type, the second conductivity type is p-type.

The substrate having the LDD-type source/drain regions 73 and the gate patterns 60a is covered with a first conformal etch stop layer 67. The first etch stop layer 67 has a surface profile which is identical to that of the substrate having the LDD-type source/drain regions 73 and the gate patterns 60a. Also, the first etch stop layer 67 is an insulating layer having an etch selectivity with respect to a silicon oxide layer. For example, the first etch stop layer 67 is composed of a silicon nitride layer or a silicon oxynitride layer. The first etch stop layer 67 is covered with an interlayer insulating layer 81. The interlayer insulating layer 81 is composed of a silicon oxide layer containing impurities or a USG layer. A second etch stop layer 79 may be interposed between the interlayer insulating layer 81 and the first etch stop layer 67. It is preferable that the second etch stop layer 79 is the same material layer as the first etch stop layer 67.

The LDD-type source/drain region 73 is exposed by a contact hole 82a that penetrates the first and second etch stop layers 67 and 79 and the interlayer insulating layer 81. The contact hole 82a is covered with an interconnection 83a. Thus, the interconnection 83a is electrically connected to the LDD-type source/drain region 73. The interconnection 83a corresponds to a power line (Vcc of FIG. 4), a ground line (Vss of FIG. 4) or a bit line (BL or /BL of FIG. 4) in the SRAM cell. Also, the interconnection 83a may be a local interconnection covering a node (N1 or N2 of FIG. 4) of the SRAM cell.

According to the present invention as mentioned above, the gate spacers are removed after forming the LDD-type source/drain regions. Thus, it is possible to reduce the aspect ratio of the gap region between the gate patterns. As a result, it can prevent a void from being generated in the interlayer insulating layer. In addition, the contact hole that exposes the LDD-type source/drain region is formed after removing the gate spacers. Thus, even though a mis-alignment occurs during the photolithography process for defining the contact hole, it is possible to maximize the surface area of the exposed LDD-type source/drain region. As a result, it is possible to remarkably reduce the contact resistance.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A semiconductor device comprising:
   an insulated gate pattern having a top and sidewalls formed on a gate insulating layer on a semiconductor substrate, the insulated gate pattern including a gate electrode;
   LDD-type source/drain regions formed in the semiconductor substrate on both sides of the insulated gate pattern;
   a first conformal etch stop layer formed on the substrate having the insulated gate pattern and the LDD-type source/drain regions, wherein the first conformal etch stop layer is in direct contact with the sidewalls of the gate pattern from the gate insulating layer to the top of the gate pattern;
   an interlayer insulating layer formed on the first etch stop layer;
   a contact hole penetrating the interlayer insulating layer and the first etch stop layer, wherein the contact hole exposes the LDD-type source/drain region; and
   a device isolation layer neighboring the LDD-type source/drain regions, wherein the contact hole further exposes the device isolation layer.

2. The semiconductor device of claim 1, wherein the first etch stop layer is a silicon nitride layer or a silicon oxynitride layer.

3. The semiconductor device of claim 1, further comprises an interconnection covering the contact hole.

4. The semiconductor device of claim 1, wherein the interlayer insulating layer is disposed between the contact hole and the sidewalls of the gate pattern.

5. The semiconductor device of claim 1, wherein the first conformal etch stop layer has a substantially uniform thickness from the gate insulating layer to the top of the gate pattern.

6. A semiconductor device comprising:
an insulated gate pattern formed on a gate insulating layer on a semiconductor substrate, the gate pattern having a top and sidewalls;
LDD-type source/drain regions formed in the semiconductor substrate on both sides of the gate pattern;
a first conformal etch stop layer formed on the substrate having the gate pattern and the LDD-type source/drain regions, the first conformal etch stop layer formed in direct contact with the sidewalls of the gate pattern from the gate insulating layer to the top of the gate pattern;
an interlayer insulating layer formed on the first etch stop layer;
a second etch stop layer interposed between the first etch stop layer and the interlayer insulating layer;
a contact hole penetrating the interlayer insulating layer, the second etch stop layer, and the first etch stop layer; and
a device isolation layer neighboring the LDD-type source/drain regions, wherein the contact hole further exposes the device isolation layer.

7. The semiconductor device of claim 6, wherein the second etch stop layer is formed of the same material layer as the first etch stop layer.

8. A semiconductor device comprising:
a plurality of first gate patterns and a plurality of second gate patterns formed on a semiconductor substrate;
first LDD-type source/drain regions of a first conductivity type formed in the semiconductor substrate on both sides of the first gate patterns;
second LDD-type source/drain regions of a second conductivity type formed in the semiconductor substrate on both sides of the second gate patterns;
a conformal etch stop layer formed on the substrate having the first and second LDD-type source/drain regions;
an interlayer insulating layer formed on the etch stop layer;
a first contact hole and a second contact hole that penetrate the interlayer insulating layer and the etch stop layer, the first contact hole exposing the first LDD-type source/drain region and the second contact hole exposing the second LDD-type source/drain region; and
wherein the first conductivity type is different from the second conductivity type,
a device isolation layer neighboring the second LDD-type source/drain regions, wherein the second contact hole further exposes the device isolation layer.

9. The semiconductor device of claim 8, further comprising a first contact plug in the first contact hole and a second contact plug in the second contact hole.

10. The semiconductor device of claim 8, further comprising another etch stop layer between the conformal etch stop layer and the interlayer insulating layer, wherein the first and the second contact hole further penetrates the another etch stop layer.

11. The semiconductor device of claim 8, each of the first LDD-type source/drain regions and the second LDD-type source/drain regions comprising:
a high-concentration source/drain region exposed by the corresponding contact hole.

12. The semiconductor device of claim 8, further comprising:
a plurality of third gate patterns formed on the semiconductor substrate; and
third LDD-type source/drain regions of the first conductivity type formed in the semiconductor substrate;
wherein the conformal etch stop layer is further in contact with a top and sidewalls of each of the first to third gate patterns.

13. The semiconductor device of claim 12, wherein:
the first to third LDD-type source/drain regions are electrically connected together;
the first gate patterns and the first LDD-type source/drain region form a driver transistor of an SRAM cell;
the second gate patterns and the second LDD-type source/drain region form a load transistor of the SRAM cell; and
the third gate patterns and the third LDD-type source/drain regions form an access transistor of the SRAM cell.

14. The semiconductor device of claim 9, wherein the first contact plug and the second contact plug are connected to each other.

15. A semiconductor device comprising:
an insulated gate pattern formed on a semiconductor substrate, the insulated gate pattern including a gate electrode and having a top and vertical sidewalls;
LDD-type source/drain regions formed in the semiconductor substrate on both sides of the gate pattern;
a first conformal etch stop layer formed on the substrate having the gate pattern and the LDD-type source/drain regions, wherein the first conformal etch stop layer is in direct contact with the gate electrode and has a substantially uniform thickness over the top and the vertical sidewalls of the gate pattern;
an interlayer insulating layer formed on the first etch stop layer;
a contact hole penetrating the interlayer insulating layer and the first etch stop layer, wherein the contact hole exposes the LDD-type source/drain; and
a device isolation layer neighboring the LDD-type source/drain regions, wherein the contact hole further exposes the device isolation layer.

16. A semiconductor device comprising:
a plurality of first gate patterns and a plurality of second gate patterns formed on a semiconductor substrate;
first LDD-type source/drain regions of a first conductivity type formed in the semiconductor substrate on both sides of the first gate patterns;
second LDD-type source/drain regions of a second conductivity type formed in the semiconductor substrate on both sides of the second gate patterns;
a conformal etch stop layer formed on the substrate having the first and second LDD-type source/drain regions;
an interlayer insulating layer formed on the etch stop layer;
a first contact hole and a second contact hole that penetrate the interlayer insulating layer and the etch stop layer, the first contact hole exposing the first LDD-type source/drain region and the second contact hole exposing the second LDD-type source/drain region;

wherein the first conductivity type is different from the second conductivity type, a plurality of third gate patterns formed on the semiconductor substrate;

third LDD-type source/drain regions of the first conductivity type formed in the semiconductor substrate;

wherein the conformal etch stop layer is further in contact with a top and sidewalls of each of the first to third gate patterns, wherein:

the first to third LDD-type source/drain regions are electrically connected together;

the first gate patterns and the first LDD-type source/drain region form a driver transistor of an SRAM cell;

the second gate patterns and the second LDD-type source/drain region form a load transistor of the SRAM cell; and the third gate patterns and the third LDD-type source/drain regions form an access transistor of the SRAM cell.

* * * * *

UNITED STATES PATENT AND TRADEMARK OFFICE
CERTIFICATE OF CORRECTION

PATENT NO. : 7,388,264 B2 Page 1 of 1
APPLICATION NO. : 10/948883
DATED : June 17, 2008
INVENTOR(S) : Do-Hyung Kim et al.

It is certified that error appears in the above-identified patent and that said Letters Patent is hereby corrected as shown below:

Column 10, line 48, the words "source/drain;" should read -- source/drain region; --

Signed and Sealed this

Twenty-seventh Day of April, 2010

David J. Kappos
*Director of the United States Patent and Trademark Office*